(12) United States Patent
Hsu

(10) Patent No.: US 11,844,285 B2
(45) Date of Patent: Dec. 12, 2023

(54) MAGNETIC TUNNEL JUNCTION MEMORY CELL WITH A BUFFER-LAYER AND METHODS FOR FORMING THE SAME

(71) Applicant: Taiwan Semiconductor Manufacturing Company Limited, Hsinchu (TW)

(72) Inventor: Chern-Yow Hsu, Chu-Bei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 227 days.

(21) Appl. No.: 17/073,591

(22) Filed: Oct. 19, 2020

(65) Prior Publication Data

US 2022/0123203 A1 Apr. 21, 2022

(51) Int. Cl.
| | | |
|---|---|---|
| H10N 50/10 | (2023.01) | |
| G11C 11/16 | (2006.01) | |
| H10B 61/00 | (2023.01) | |
| H10N 50/01 | (2023.01) | |
| H10N 50/80 | (2023.01) | |
| H10N 50/85 | (2023.01) | |

(52) U.S. Cl.
CPC ............ H10N 50/10 (2023.02); G11C 11/161 (2013.01); H10B 61/00 (2023.02); H10N 50/01 (2023.02); H10N 50/80 (2023.02); H10N 50/85 (2023.02)

(58) Field of Classification Search
CPC ......... H01L 43/08; H01L 43/02; H01L 43/10; H01L 43/12; H01L 27/22; H01L 27/222
See application file for complete search history.

(56) References Cited

U.S. PATENT DOCUMENTS

| | | | | |
|---|---|---|---|---|
| 2008/0096290 | A1* | 4/2008 | Smith | H01L 43/12 |
| | | | | 438/3 |
| 2013/0032907 | A1* | 2/2013 | Satoh | H01L 43/08 |
| | | | | 257/E29.323 |
| 2013/0119494 | A1* | 5/2013 | Li | H01L 43/08 |
| | | | | 257/E43.001 |

(Continued)

OTHER PUBLICATIONS

Gutsche et al., "Patterning of 0.175 μm platinum features using Ar/O2 chemically assisted ion-beam etching", Journal of Vacuum Science & Technology B: Microelectronics and Nanometer Structures Processing, Measurement, and Phenomena 18, 765-773 (2000).*

(Continued)

*Primary Examiner* — Yara B Green
*Assistant Examiner* — Fakeha Sehar
(74) *Attorney, Agent, or Firm* — The Marbury Law Group, PLLC

(57) ABSTRACT

A memory cell structure including a dielectric cap layer disposed over a substrate and a first dielectric layer disposed over the dielectric cap layer. The memory cell structure may further include a buffer layer disposed over the first dielectric layer, a connection via structure embedded in the buffer layer, the first dielectric layer, and the dielectric cap layer. The memory cell structure may further include may further include a bottom electrode disposed on the connection via structure and the buffer layer, and a magnetic tunnel junction (MTJ) memory cell including one or more MTJ layers disposed on the bottom electrode.

19 Claims, 11 Drawing Sheets

(56) References Cited

U.S. PATENT DOCUMENTS

| | | | | |
|---|---|---|---|---|
| 2016/0028000 | A1* | 1/2016 | Tsai | H01L 43/08 |
| | | | | 438/3 |
| 2017/0317143 | A1* | 11/2017 | Chen | H01L 23/5226 |
| 2018/0159023 | A1* | 6/2018 | Suh | H10B 61/00 |
| 2018/0212140 | A1* | 7/2018 | Noh | H10N 50/85 |
| 2019/0157344 | A1* | 5/2019 | Wei | H10N 50/10 |
| 2019/0157548 | A1* | 5/2019 | Wu | H10N 50/01 |
| 2020/0152864 | A1 | 5/2020 | Wu et al. | |
| 2021/0091139 | A1* | 3/2021 | Tseng | H10N 50/10 |

OTHER PUBLICATIONS

Pallab K. Chatterjee, Satwinder D.S. Malhi, Michiel deWit, Harold Hosack, Mark G. Harward, Mehrdad M. Moslehi, Harold Hosack, 20-Integrated Circuits, Editor(s): Wendy M. Middleton, Mac E. Van Valkenburg, Reference Data for Engineers (Ninth Edition), Newnes, 2002, pp. 20-21-20-113, ISBN 9780750672917.*

* cited by examiner

MAGNETIC TUNNEL JUNCTION MEMORY CELL WITH A BUFFER-LAYER AND METHODS FOR FORMING THE SAME

BACKGROUND

Semiconductor manufacturing may implement ion beam etching to form various layers having various patterns throughout a semiconductor stack-up. Ion beam etching may selectively etch portions of the same layer(s) at different rates depending on a loading effect in which certain portions of a topmost layer are exposed to ion beams at an increased rate than other portions of the same layer. Thus, one region of a material layer may be etched at an increased rate as compared to another region of the same material layer. As a result of this selective etching, logic portions of a semiconductor device may be exposed throughout various layers, subjecting the logic portions to contamination.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
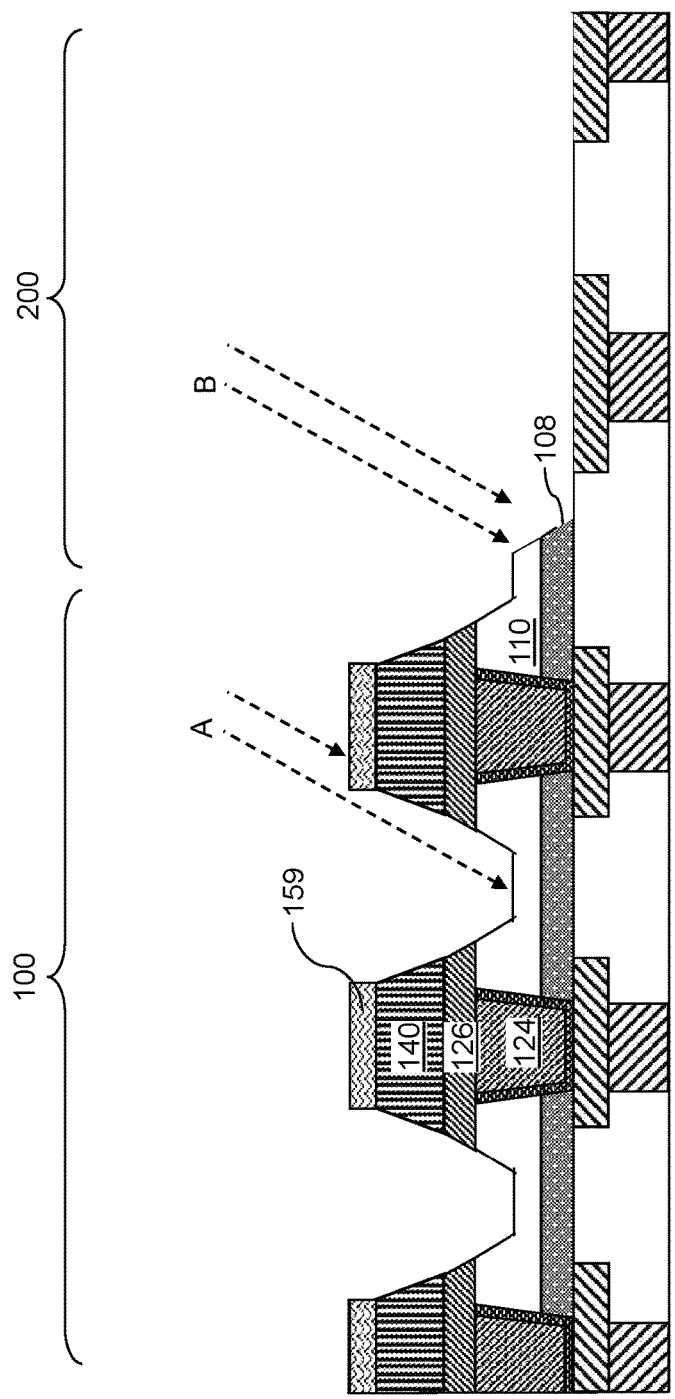
FIG. 1 is a vertical cross-sectional view of an MTJ memory cell structure after formation of an array of memory cells and an array of metallic etch stop portions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to form a memory cell and/or an array of memory cells. Specifically, the structures and methods of the present disclosure may be employed to form a magnetic tunnel junction memory cell and/or an array of magnetic tunnel junction memory cells. While the present disclosure is described employing an exemplary structure including magnetic tunnel junction memory cells, the methods of the present disclosure may be used to form any memory cell or any array of memory cells including a vertical stack of patterned material portions that constitutes a memory cell and containing a top electrode.

It is to be understood that the memory devices according to embodiments of the present disclosure may comprise a single discrete memory cell, a one-dimensional array of memory cells, or a two-dimensional array of memory cells. It is also to be understood that a one-dimensional array of memory cells of the present disclosure may be implemented as a periodic one-dimensional array of memory cells, and a two-dimensional array of memory cells of the present disclosure may be implemented as a periodic two-dimensional array of memory cells. In addition, while present disclosure is described using an embodiment in which a two-dimensional array of memory cells is formed within a specific metal interconnect level, embodiments are expressly contemplated herein in which the two-dimensional array of memory cells is formed within different metal interconnect levels.

FIG. 1 is a vertical cross-sectional view of an MTJ memory cell structure after formation of an array of memory cells and an array of metallic etch stop portions. FIG. 1 illustrates the loading effect that occurs during formation of an MTJ memory cell structure. Referring to FIG. 1, an ion beam etching (IBE) may be performed to transfer the pattern of metallic etch mask portions 159 through a layer stack including a bottom electrode material layer 126 and a MTJ layer 140. The layer stack of the metallic etch mask material portions 159, the MTJ layer 140, and the bottom electrode material layer 126 may be patterned into an array of memory cells (126, 140) based on the metallic etch mask portions 159.

As a result of the angular orientation of the IBE process, as illustrated by ion beams A and B (illustrated as dashed lines), the memory array region 100 and the logic region 200 may be etched at different rates due to a loading effect. The loading effect is the result of the various densities of layers at the IBE stage, such that varying topological pattern variations will cause different etching rates throughout the stack-up. For example, the memory array region 100 may be subject to a shading effect due to the density of the array of memory cells (126, 140) and the array of metallic etch mask portions 159. The shading effect reduces the exposure of the connection-via-level dielectric layer 110 to the ion beams A such that the top-most portions (e.g., metallic etch mask portions 159) of the memory array region 100 may limit the amount of ion beams able to reach the connection-via-level dielectric layer 110. Comparatively, the logic region 200 may have a lower element density and may not be subject to a shading effect caused by dense MTJ portions, such that the connection-via-level dielectric layer 110 has increased exposure to the ion beams B. Consequently, the connection-via-level dielectric layer 110 in the logic region 200 may be etched at a higher etching rate than in the memory array region 100. For example, portions of the connection-via-level dielectric layer 110 in the memory array region 100 may be recessed by around 130 A as a result of the ion beam etching process, while portions of the connection-via-level dielectric layer 110 in the logic region 200 may be recessed by around 500 A.

In some instances, depending on the thickness and material composition of the connection-via-level dielectric layer 110, the connection-via-level dielectric layer 110 may be fully etched away in the logic region 200. In such instances, the dielectric cap layer 108 may be fully exposed to the ion beam etching process. This may cause some of the dielectric cap layer 108 to be etched away. In some instances, all of the dielectric cap layer 108 may be etched away, therefore causing the metal interconnect structures 648 to be exposed and subject to contamination.

The increased recession of the connection-via-level dielectric layer 110 within the logic region 200 due to the loading effect as compared to the memory array region 100 is a result of the inherent ion beam etching rates of the connection-via-level dielectric layer 110. The bottom electrode material layer 126 may be formed from a material such as titanium nitride (TiN), which has a relative etching rate of 1. For example, the connection-via-level dielectric layer 110 may be formed from an oxide-based material having a relative etching rate about 2.8 (i.e. in relation to a relative etching rate of 1 for TiN). The selectivity of the oxide (connection-via-level dielectric layer 110) to the TiN (bottom electrode material layer 126) is poor, having a total etching rate of 2.2 to 2.9 within the logic region 200 relative to the etching rate of the bottom electrode material layer 126. For example, a connection-via-level dielectric layer 110 comprised of oxide may be ion beam etched at a rate that is 2.2 to 2.9 times as fast as the rate to ion beam etch a bottom electrode material layer 126L comprised of TiN.

The increased recession of the connection-via-level dielectric layer 110 within the logic region 200 due to the loading effect as compared to the memory array region 100 may cause further complications in subsequent etching processes. Additional etch processes may be performed during the subsequent formation of structures after the IBE etch process has been performed. For example, additional etch processes may be performed when forming dielectric spacers (not shown) around the array of memory cells (126, 140). The additional anisotropic etch process performed to form structures such as an array of inner dielectric spacer portions may also be applied to any remaining portions of the connection-via-level dielectric layer 110 and the dielectric cap layer 108 in the logic region 200. The remaining portions of the connection-via-level dielectric layer 110 and the dielectric cap layer 108 in the logic region 200 subject to increased recession due to the loading effect may not be thick enough to persist through any subsequent etching processes. Thus, performing subsequent etching processes after ion beam etching may result in the complete removal of the connection-via-level dielectric layer 110 and the dielectric cap layer 108 in the logic region 200. Exposing the metal interconnect structures 648 in the logic region 200 to subsequent etching processes may result in contamination of the metal interconnect structures 648, causing reduced conductivity or other complications in the manufacturing process resulting in ineffective devices.

Various embodiments of the present disclosure allow for mitigating the loading effect as well as reducing the contamination of metal layers. Various embodiments include devices and methods for a buffer layer in magnetoresistive random-access memory (MRAM) designs for mitigating underneath loading effect.

Figure 2:
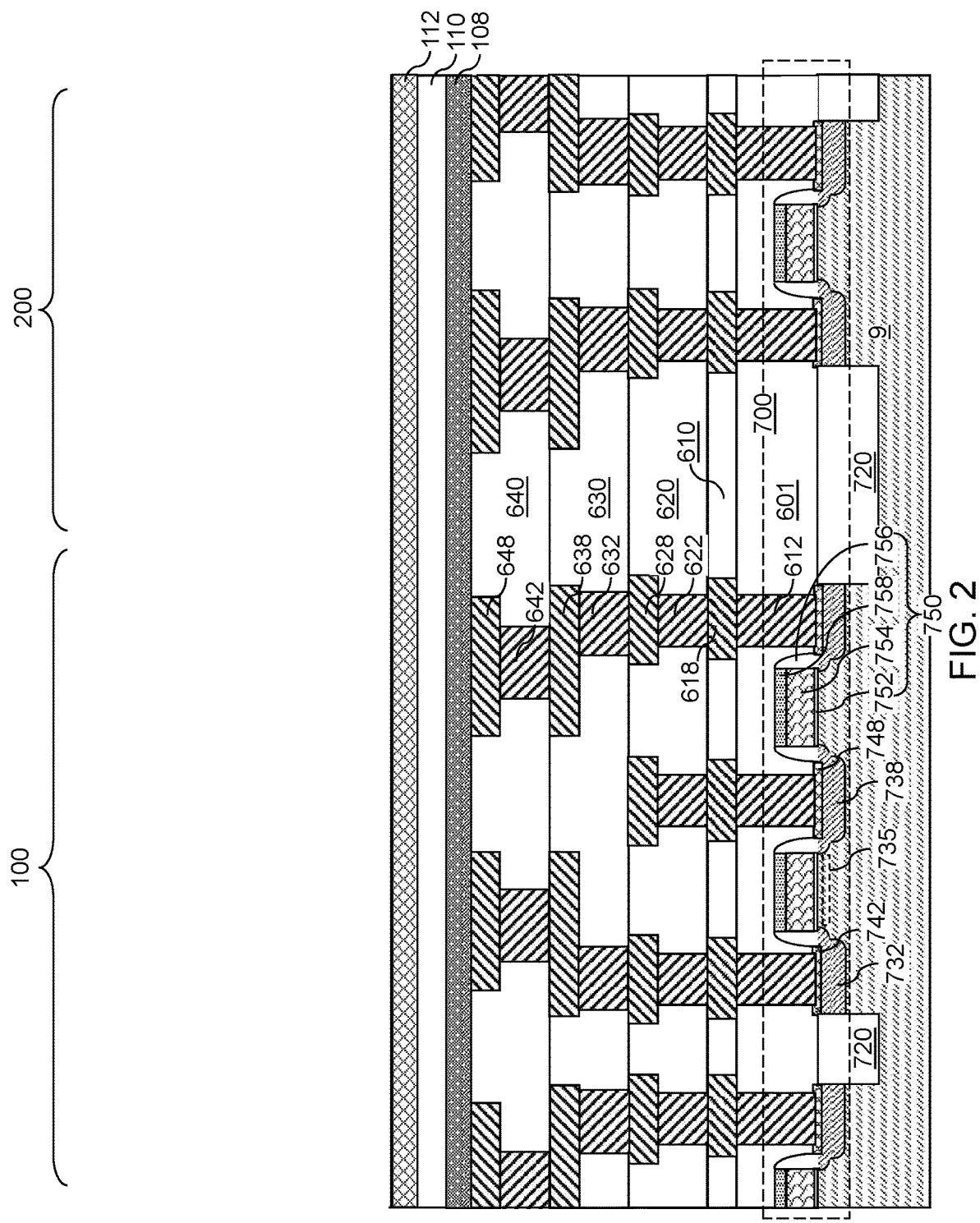
FIG. 2 is a vertical cross-sectional view of an exemplary structure after formation of complementary metal-oxide-semiconductor (CMOS) transistors and metal interconnect structures formed in dielectric material layers and an ion beam etching buffer layer according to an embodiment of the present disclosure.

FIG. 2 is a vertical cross-sectional view of an exemplary structure after formation of complementary metal-oxide-semiconductor (CMOS) transistors and metal interconnect structures formed in dielectric material layers and an ion beam etching buffer layer according to an embodiment of the present disclosure. Referring to FIG. 2, an exemplary structure according to an embodiment of the present disclosure is illustrated. The exemplary structure includes a substrate 9, which may be a semiconductor substrate such as a commercially available silicon substrate. Shallow trench isolation structures 720 including a dielectric material such as silicon oxide may be formed in an upper portion of the substrate 9. Suitable doped semiconductor wells, such as p-type wells and n-type wells, may be formed within each area that is laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 100 in which an array of memory elements is subsequently formed, and a logic region 200 in which logic devices that support operation of the array of memory elements are formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the logic region 200 at this processing step. Devices (such as field effect transistors) in the logic region 200 may provide functions that are needed to operate the array of memory cells to be subsequently formed. Specifically, devices in the logic region 200 may be configured to control the programming operation, the erase operation, and the sensing (read) operation of the array of memory cells. For example, the devices in the logic region 200 may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures (612, 618, 622, 628, 632, 638, 642, 648) formed in dielectric material layers (601, 610, 620, 630, and 640) may be subsequently formed over the substrate 9 and the devices (such as field effect transistors). The dielectric material layers may include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contact a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 (i.e. copper metal contact/copper substrate used to convey logic signals throughout the logic region 200) formed in an upper portion of the fourth line-and-via-level dielectric material layer 640. In one embodiment, the second metal line structures 628 may include source lines that are connected a source-side power supply for an array of memory elements. The voltage provided by the source lines may be applied to the bottom electrodes through the access transistors provided in the memory array region 100.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, copper (Cu), Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures, and/or the third metal via structures 642 and the fourth metal line structures 648 may be formed as integrated line and via structures. While the present disclosure is described using an embodiment in which an array of memory cells formed over the fourth line-and-via-level dielectric material layer 640, embodiments are expressly contemplated herein in which the array of memory cells may be formed at a different metal interconnect level.

A dielectric cap layer 108 and a connection-via-level dielectric layer 110 may be sequentially formed over the metal interconnect structures and the dielectric material layers. For example, the dielectric cap layer 108 may be formed on the top surfaces of the fourth metal line structures 648 and on the top surface of the fourth line-and-via-level dielectric material layer 640. The dielectric cap layer 108 includes a dielectric capping material that may protect underlying metal interconnect structures such as the fourth metal line structures 648. In one embodiment, the dielectric cap layer 108 may include a material that may provide high etch resistance, i.e., a dielectric material and also may function as an etch stop material during a subsequent anisotropic etch process that etches the connection-via-level dielectric layer 110. For example, the dielectric cap layer 108 may include silicon carbide or silicon nitride, and may have a thickness in a range from 5 nm to 30 nm, although lesser and greater thicknesses may also be used.

The connection-via-level dielectric layer 110 may include any material that may be used for the dielectric material layers (601, 610, 620, 630, 640). For example, the connection-via-level dielectric layer 110 may include undoped silicate glass or a doped silicate glass deposited by decomposition of tetraethylorthosilicate (TEOS). The thickness of the connection-via-level dielectric layer 110 may be in a range from 50 nm to 200 nm, although lesser and greater thicknesses may also be used. The dielectric cap layer 108 and the connection-via-level dielectric layer 110 may be formed as planar blanket (unpatterned) layers having a respective planar top surface and a respective planar bottom surface that extends throughout the memory array region 100 and the logic region 200.

A buffer layer 112 may be sequentially formed over the connection-via-level dielectric layer 110. The buffer layer 112 may include an ion-beam etching-resistant material that may protect the dielectric cap layer 108, the connection-via-level dielectric layer 110, and the underlying metal interconnect structures such as the fourth metal line structures 648. For example, the buffer layer 112 may be comprised of a material to mitigate the loading effects applied during the ion beam etching process, such that the buffer layer 112 may be etched at a reduced rate as compared to implementations utilizing only a dielectric cap layer 108 and a connection-via-level dielectric layer 110, thus preventing the fourth metal line structures 648 from being exposed and therefore contaminated during subsequent etching processes. In one embodiment, the buffer layer 112 may include a material that may provide high etch resistance, such as aluminum oxide ($Al_2O_3$), which may have a relative ion beam etching rate of 0.8 to 1.3 relative to the etching rate of the bottom electrode material layer 126L. For example, a buffer layer 112 comprised of $Al_2O_3$ may be ion beam etched at a rate of 0.8-1.3 times as fast as the rate to ion beam etch a bottom electrode material layer 126L comprised of TiN. In one embodiment, the buffer layer 112 may include a material such as tantalum pentoxide ($Ta_2O_5$). The buffer layer 112 may have a thickness in a range from 5 nm to 80 nm, such as from 10 nm to 70 nm, although lesser and greater thicknesses may also be used. The buffer layer 112 may be formed as planar blanket (unpatterned) layers having a respective planar top surface and a respective planar bottom surface that extends throughout the memory array region 100 and the logic region 200. In one embodiment, the buffer layer 112 may have a ratio of thickness of 0.7 to 1 relative to the thickness of the bottom electrode layer 126L.

Figure 3:
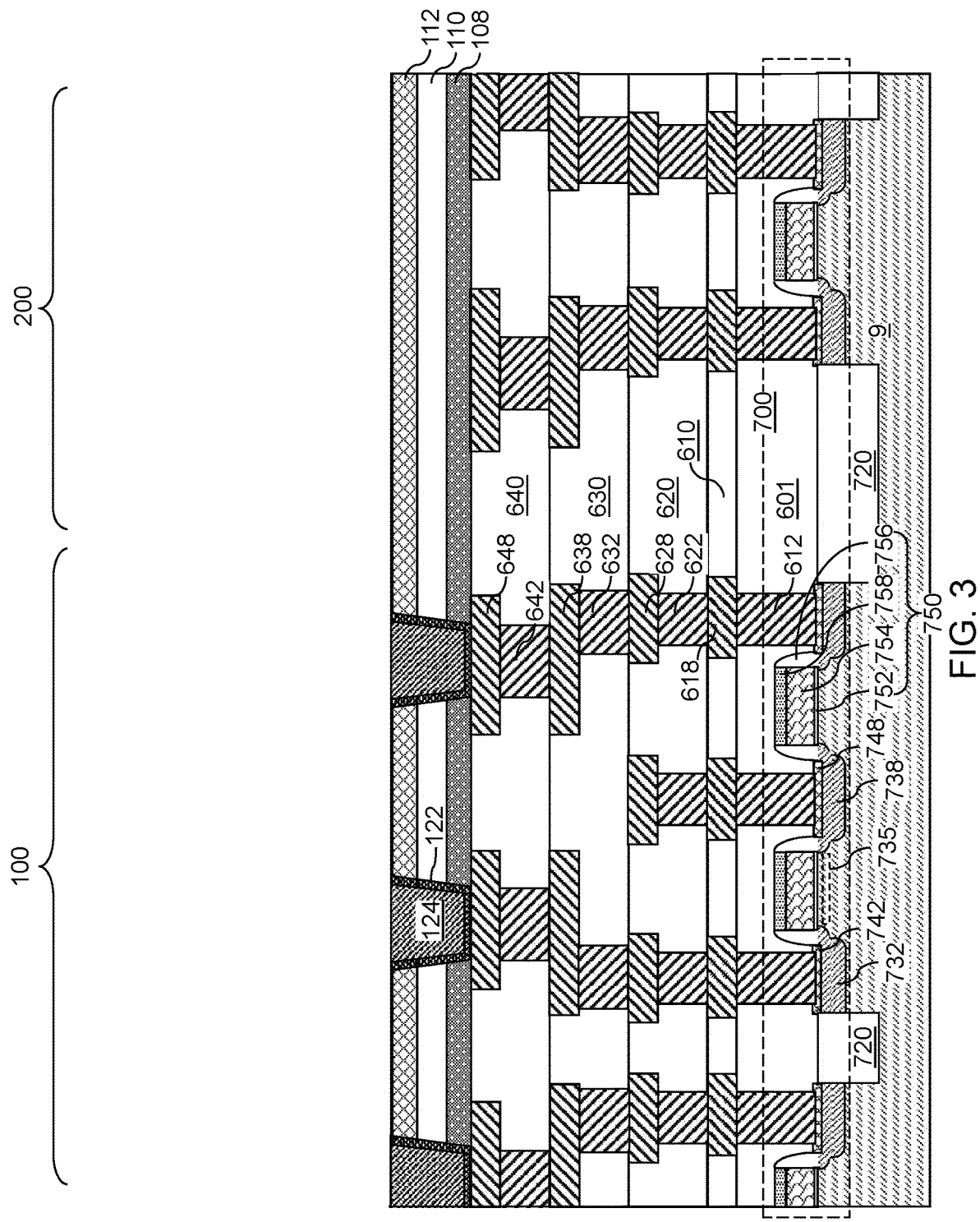
FIG. 3 is a vertical cross-sectional view of the exemplary structure after formation of an array of connection via structures according to an embodiment of the present disclosure.

FIG. 3 is a vertical cross-sectional view of the exemplary structure after formation of an array of connection via structures according to an embodiment of the present disclosure. Referring to FIG. 3, via cavities may be formed through the buffer layer 112, the connection-via-level dielectric layer 110, and the dielectric cap layer 108. For example, a photoresist layer (not shown) may be applied over the buffer layer 112 and may be patterned to form opening within areas of the memory array region 100 that overlie a respective one of the fourth metal line structures 648. An anisotropic etch may be performed to transfer the pattern in the photoresist layer through the buffer layer 112, the connection-via-level dielectric layer 110, and the dielectric cap layer 108. The lower-electrode-contact via cavities may have tapered sidewalls having a taper angle (within respective to a vertical direction) in a range from 1 degree to 10 degrees. A top surface of a fourth metal line structure 648 may be physically exposed at the bottom of each lower-electrode-contact via cavity. The photoresist layer may be subsequently removed, for example, by ashing.

A metallic barrier layer 122 may be formed as a material layer. The metallic barrier layer may cover physically exposed top surfaces of the fourth metal line structures 648, tapered sidewalls of the lower-electrode-contact via cavities, and the top surface of buffer layer 112 without any hole therethrough. The metallic barrier layer 122 may include a conductive metallic nitride such as TiN, TaN, and/or WN. Other suitable materials within the contemplated scope of disclosure may also be used. The thickness of the metallic barrier layer 122 may be in a range from 3 nm to 20 nm, although lesser and greater thicknesses may also be used.

A metallic fill 124 material such as tungsten or copper may be deposited in remaining volumes of the lower-electrode-contact via cavities. Portions of the metallic fill 124 material and the metallic barrier layer 122 that overlie the horizontal plane including the topmost surface of the buffer layer 112 may be removed by a planarization process such as chemical mechanical planarization to form. Each remaining portion of the metallic fill material located in a respective via cavity comprises a metallic via fill material portion 124. Each remaining portion of the metallic barrier layer 122 in a respective via cavity comprises a metallic barrier layer 122. Each combination of a metallic barrier layer 122 and a metallic fill material portion 124 that fills a via cavity constitutes a connection via structure (122, 124). An array of connection via structures (122, 124) may be formed in the buffer layer 112 and the connection-via-level dielectric layer 110 on underlying metal interconnect structures.

Figure 4:
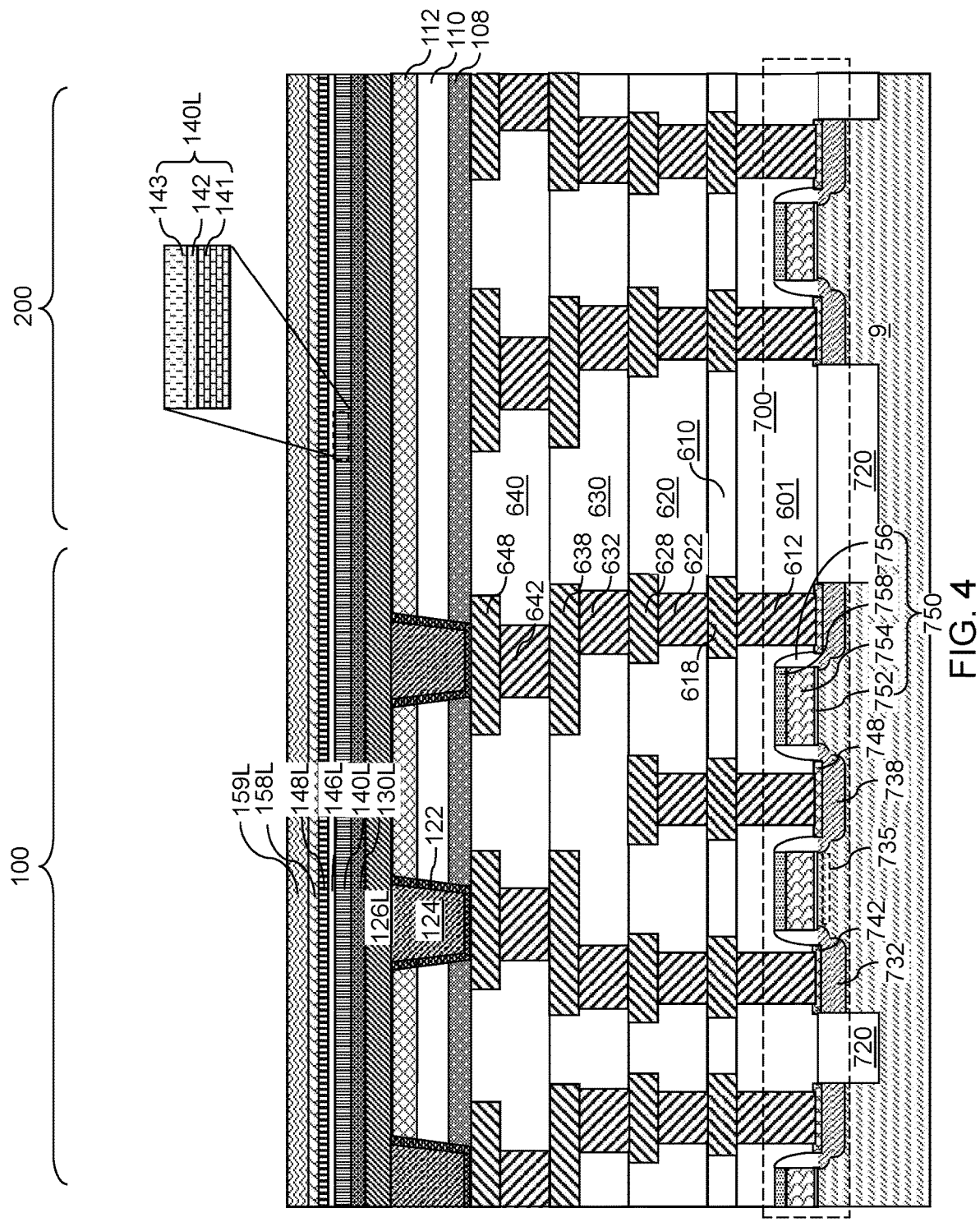
FIG. 4 is a vertical cross-sectional view of the exemplary structure after formation of a bottom electrode material layer, a nonmagnetic metallic buffer layer, a synthetic anti-ferromagnetic layer, a nonmagnetic tunnel barrier layer, a free magnetization layer, a top electrode material layer, and a metallic etch mask material layer according to an embodiment of the present disclosure.

FIG. 4 is a vertical cross-sectional view of the exemplary structure after formation of a bottom electrode material layer, a nonmagnetic metallic buffer layer, a synthetic antiferromagnet layer, a nonmagnetic tunnel barrier layer, a free magnetization layer, a top electrode material layer, and a metallic etch mask material layer according to an embodiment of the present disclosure. Referring to FIG. 4, a layer stack including a bottom electrode material layer 126L, a nonmagnetic metallic buffer material layer 130L, a synthetic antiferromagnet layer 140L, a nonmagnetic tunnel barrier material layer 146L, a free magnetization material layer 148L, a top electrode material layer 158L, and a metallic etch mask material layer 159L may be formed over the metallic barrier layer and the metallic via fill material portions 124. The layers within the layer stack may be deposited by a respective chemical vapor deposition process or a respective physical vapor deposition process. Each layer within the layer stack may be deposited as planar blanket material layers having a respective uniform thickness throughout. The nonmagnetic metallic buffer material layer 130L, the synthetic antiferromagnet layer 140L, the nonmagnetic tunnel barrier material layer 146L, and the free magnetization material layer 148L are collectively referred to as memory material layers. In other words, memory material layers are formed between the bottom electrode material layer 126L and the top electrode material layer 158L.

While the present disclosure is described employing an embodiment in which the memory material layers include the nonmagnetic metallic buffer material layer 130L, the synthetic antiferromagnet layer 140L, the nonmagnetic tunnel barrier material layer 146L, and the free magnetization material layer 148L, the methods and structures of the present disclosure may be applied to any structure in which the memory material layers include a different layer stack provided between a bottom electrode material layer 126L and a top electrode material layer 158L and include material layers that may store information in any manner. Modifications of the present disclosure are expressly contemplated herein in which the memory material layers include a phase change memory (PCM) material, a ferroelectric (Fe) memory material, or a vacancy-modulated conductive oxide material.

The bottom electrode material layer 126L includes at least one nonmagnetic metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 126L may include, and/or may consist essentially of, an elemental metal such as W, Cu, Ti, Ta, Ru, Co, Mo, or Pt. The thickness of the bottom electrode material layer 126L may be in a range from 10 nm to 100 nm, although lesser and greater thicknesses may also be used.

The nonmagnetic metallic buffer material layer 130L includes a nonmagnetic material that may function as a seed layer. Specifically, the nonmagnetic metallic buffer material layer 130L may provide a template crystalline structure that aligns polycrystalline grains of the materials of the synthetic antiferromagnet layer 140L along directions that maximizes the magnetization of a reference layer within the synthetic antiferromagnet layer 140L. The nonmagnetic metallic buffer material layer 130L may include Ti, a CoFeB alloy, a NiFe alloy, ruthenium, or a combination thereof. The thickness of the nonmagnetic metallic buffer material layer 130L may be in a range from 3 nm to 30 nm, although lesser and greater thicknesses may also be used.

The synthetic antiferromagnet (SAF) layer 140L may include a layer stack of a ferromagnetic hard layer 141, an antiferromagnetic coupling layer 142, and a reference magnetization layer 143. Each of the ferromagnetic hard layer 141 and the reference magnetization layer 143 may have a respective fixed magnetization direction. The antiferromagnetic coupling layer 142 provides antiferromagnetic coupling between the magnetization of the ferromagnetic hard layer 141 and the magnetization of the reference magnetization layer 143 so that the magnetization direction of the ferromagnetic hard layer 141 and the magnetization direction of the reference magnetization layer 143 remain fixed during operation of the memory cells to be subsequently formed. The ferromagnetic hard layer 141 may include a hard ferromagnetic material such as PtMn, IrMn, RhMn, FeMn, OsMn, etc. The reference magnetization layer 143 may include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 142 may include ruthenium or iridium. The thickness of the antiferromagnetic coupling layer 142 may be selected such that the exchange interaction induced by the antiferromagnetic coupling layer 142 stabilizes the relative magnetization directions of the ferromagnetic hard layer 141 and the reference magnetization layer 143 at opposite directions, i.e., in an antiparallel alignment. In one embodiment, the net magnetization of the SAF layer 140L by matching the magnitude of the magnetization of the ferromagnetic hard layer 141 with the magnitude of the magnetization of the reference magnetization layer 143. The thickness of the SAF layer 140L may be in a range from 5 nm to 30 nm, although lesser and greater thicknesses may also be used.

The nonmagnetic tunnel barrier material layer 146L may include a tunneling barrier material, which may be an electrically insulating material having a thickness that allows electron tunneling. For example, the nonmagnetic tunnel barrier material layer 146L may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the nonmagnetic tunnel barrier material layer 146L may be 0.7 nm to 1.3 nm, although lesser and greater thicknesses may also be used.

The free magnetization material layer 148L includes a ferromagnetic material having two stable magnetization directions that are parallel or antiparallel to the magnetization direction of the reference magnetization layer 143. The free magnetization material layer 148L includes a hard ferromagnetic material such as Co, CoFe, CoFeB, CoFeTa, NiFe, CoPt, CoFeNi, etc. Other suitable materials within the contemplated scope of disclosure may also be used. The thickness of the free magnetization material layer 148L may be in a range from 1 nm to 6 nm, although lesser and greater thicknesses may also be used.

The top electrode material layer 158L includes a top electrode material, which may include any nonmagnetic material that may be employed for the bottom electrode material layer 126L. Exemplary metallic materials that may be employed for the top electrode material layer 158L include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 126L may include, and/or may consist essentially of, an elemental metal such as W, Cu, Ti, Ta, Ru, Co, Mo, or Pt. The thickness of the top electrode material layer 158L may be in a range from 10 nm to 100 nm, although lesser and greater thicknesses may also be used.

The metallic etch mask material layer 159L includes a metallic etch stop material that provides high resistance to an anisotropic etch process to be subsequently employed to etch a dielectric material (which may include, for example, undoped silicate glass, a doped silicate glass, or organosilicate glass). In one embodiment, the metallic etch mask material layer 159L may include a conductive metallic nitride material (such as TiN, TaN, or WN) or a conductive metallic carbide material (such as TiC, TaC, or WC). In one embodiment, the metallic etch mask material layer 159L includes, and/or consists essentially of, TiN. The metallic etch mask material layer 159L may be deposited by chemical vapor deposition or physical vapor deposition. The thickness of the metallic etch mask material layer 159 may be in a range from 2 nm to 20 nm, such as from 3 nm to 10 nm, although lesser and greater thicknesses may also be employed.

Figure 5:
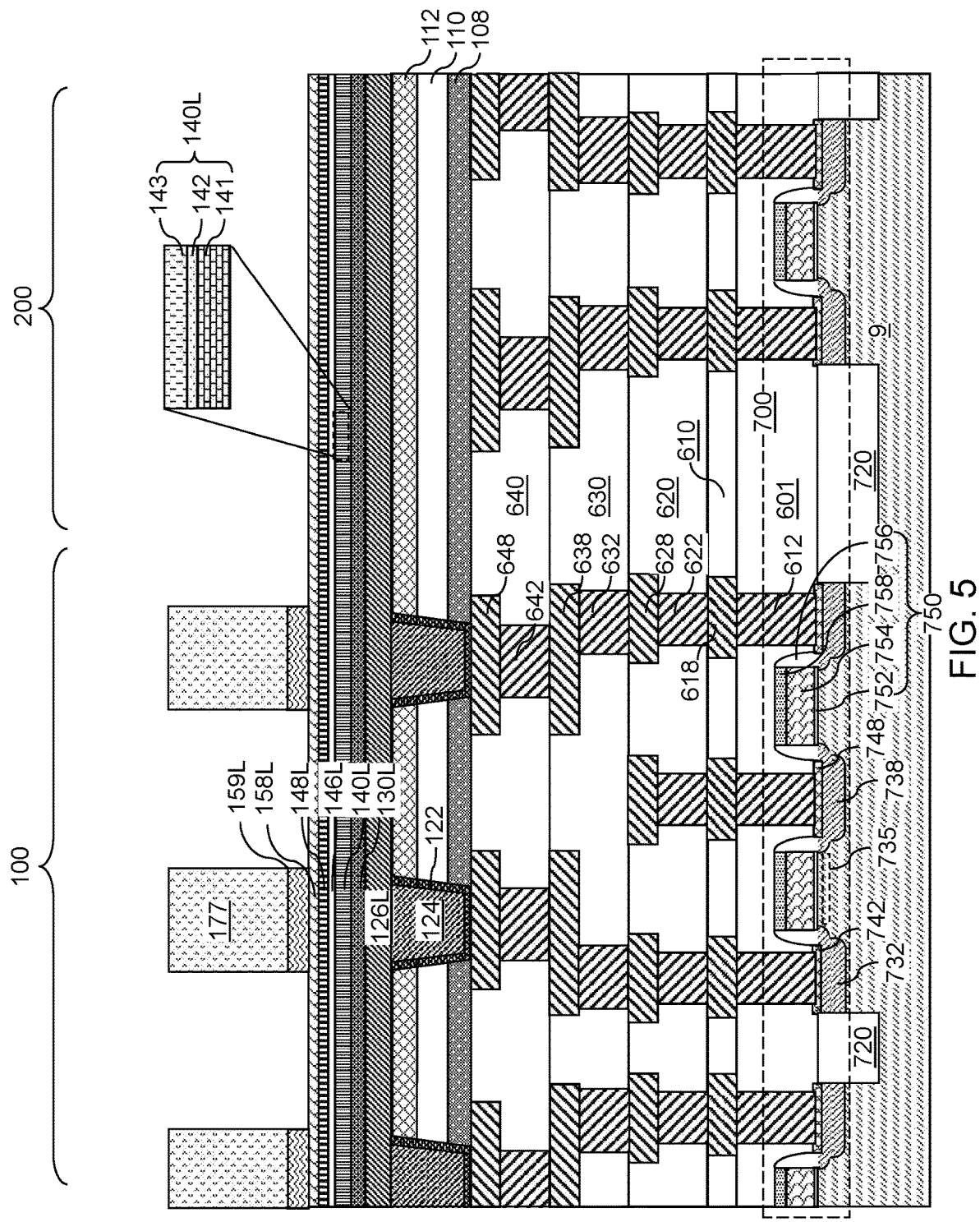
FIG. 5 is a vertical cross-sectional view of the exemplary structure after patterning the metallic etch mask material layer into metallic etch mask portions according to an embodiment of the present disclosure.

FIG. 5 is a vertical cross-sectional view of the exemplary structure after patterning the metallic etch mask material layer into metallic etch mask portions according to an embodiment of the present disclosure. Referring to FIG. 5, a photoresist layer 177 may be applied over the metallic etch mask material layer 159L, and may be lithographically patterned to form an array of discrete photoresist material portions. Each discrete photoresist material portion in the array of discrete photoresist material portions may overlie a respective one of the connection via structures (122, 124). In one embodiment, the connection via structures (122, 124) may be arranged as a two-dimensional periodic array having a first pitch along a first horizontal direction and a second pitch along a second horizontal direction. The discrete photoresist material portions may be arranged as a two-dimensional periodic array having the same periodicity as the two-dimensional periodic array of the connection via structures (122, 124).

A first anisotropic etch process may be performed to etch unmasked regions of the metallic etch mask material layer 159L. The first anisotropic etch process employs the photoresist layer 177 as an etch mask, and patterned portions of the metallic etch mask material layer 159L comprise metallic etch mask portion 159. The first anisotropic etch process patterns the metallic etch mask material layer 159L into a two-dimensional array of metallic etch mask portions 159. The two-dimensional array of metallic etch mask portions 159 may replicate the pattern of the photoresist layer 177. The photoresist layer 177 may be removed after the first anisotropic etch process, or may remain on the two-dimensional array of metallic etch mask portions 159 during a subsequent second anisotropic etch process.

Figure 6:
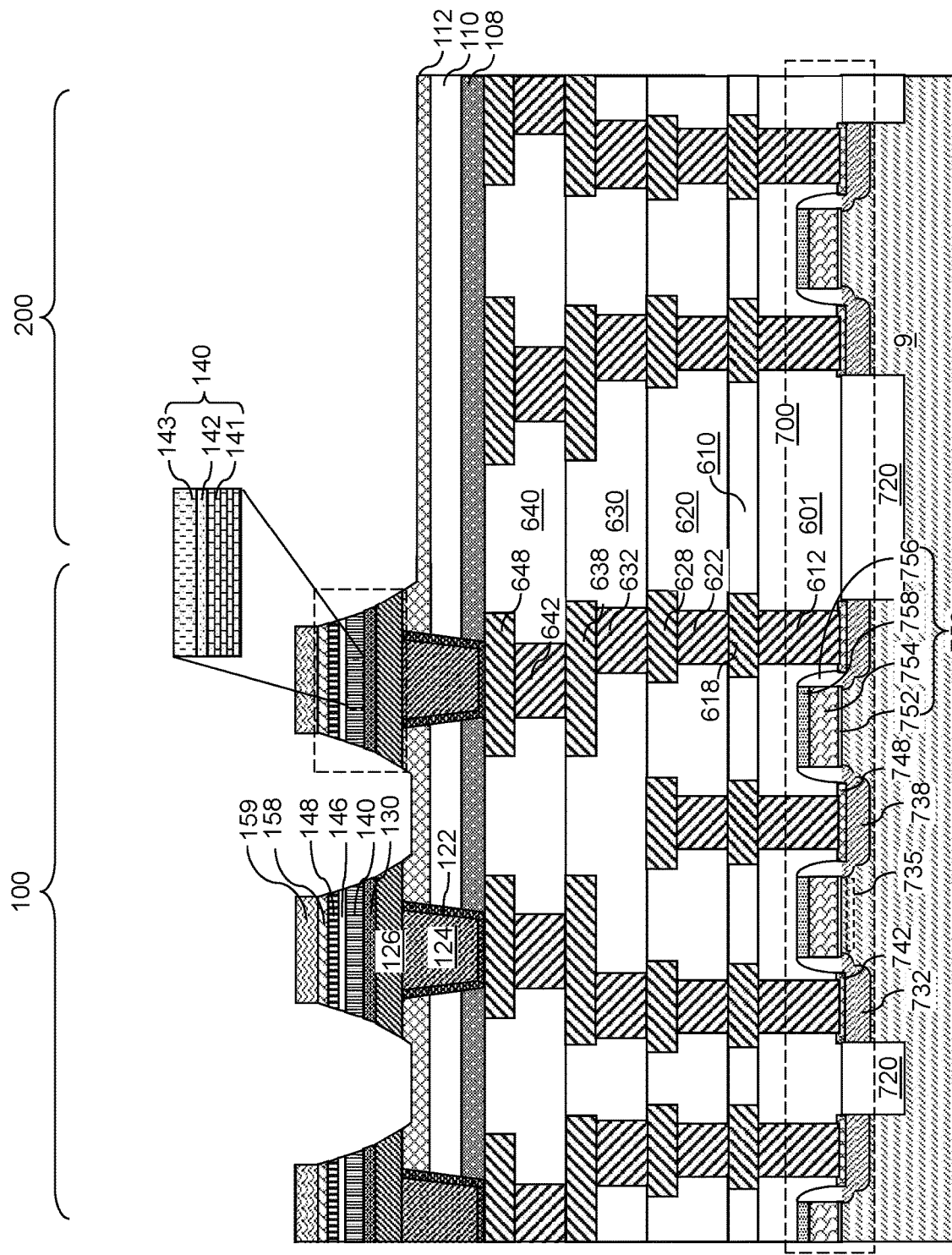
FIG. 6 is a vertical cross-sectional view of the exemplary structure after formation of an array of memory cells and an array of metallic etch stop portions according to an embodiment of the present disclosure.

FIG. 6 is a vertical cross-sectional view of the exemplary structure after formation of an array of memory cells and an array of metallic etch stop portions according to an embodiment of the present disclosure. Referring to FIG. 6, a second anisotropic etch process, such as ion beam etching, may be performed to transfer the pattern of the two-dimensional array of metallic etch mask portions 159 through the layer stack including the top electrode material layer 158L, the free magnetization material layer 148L, the nonmagnetic tunnel barrier material layer 146L, the synthetic antiferromagnet layer 140L, the nonmagnetic metallic buffer material layer 130L, and the bottom electrode material layer 126L. Portions of the layer stack (158L, 148L, 146L, 140L, 130L, 126L) that are not masked by the metallic etch mask portions 159 may be etched during the second anisotropic etch process. In embodiments in which the photoresist layer 177 is present at the beginning of the second anisotropic etch process, the photoresist layer 177 may be collaterally consumed during the second anisotropic etch process, and the metallic etch mask portions 159 may be employed as an etch mask at least during patterning of the bottom electrode material layer 126L. Alternatively, in embodiments in which the photoresist layer 177 is removed prior to the second anisotropic etch process, the metallic etch mask portions 159 may be employed as an etch mask throughout the second anisotropic etch process.

The second anisotropic etch process may include a series of anisotropic etch steps that sequentially etches the various material layers of the underlying layer stack. In one embodiment, patterned portions of the layer stack may include sidewalls having a non-zero taper angle, i.e., having a non-vertical surface. The taper angle may vary from layer to layer, and generally may be in a range from 3 degrees to 30 degrees, such as from 6 degrees to 20 degrees, although lesser and greater taper angles may also be employed.

Unmasked portions of the buffer layer 112 may be vertically recessed by the second anisotropic etch process. For example, as a result of the loading effect caused during ion beam etching, the exposed surfaces of the buffer layer 112 may be recessed to a greater degree in the logic region 200 than in the memory array region 100. In other words, portions of the buffer layer 112 are thicker in the memory array region 100 than in the logic region 200. However, due to the etching rate of the buffer layer 112 material (Al2O3, Ta2O5, etc.), the buffer layer 112 may persist through the ion beam etching process, thus allowing the underlying layers (connection-via-level dielectric layer 110, dielectric cap layer 108) from being exposed, allowing the protection of the metal line structures 648 during subsequent etching processes. For example, the selectivity of the Al2O3 (buffer layer 112) to the TiN (bottom electrode material layer 126L) allows for the minimization of the load effect, having a relative etching rate of 0.8 to 1.3 within the logic region 200 relative to the etching rate of the bottom electrode material layer 126L. For example, a buffer layer 112 comprised of Al2O3 may be ion beam etched at a rate of 0.8-1.3 times as fast as the rate to ion beam etch a bottom electrode material layer 126L comprised of TiN.

The layer stack (159L, 158L, 148L, 146L, 140L, 130L, 126L) of the metallic etch mask material layer 159L, the top electrode material layer 158L, the free magnetization material layer 148L, the nonmagnetic tunnel barrier material layer 146L, the synthetic antiferromagnet layer 140L, the nonmagnetic metallic buffer material layer 130L, and the bottom electrode material layer 126L may be patterned into an array of memory cells (126, 130, 140, 146, 148, 158) and an array of metallic etch mask portions 159. Each of the memory cells (126, 130, 140, 146, 148, 158) comprises a bottom electrode 126, a memory material stack (130, 140, 146, 148), and a top electrode 158. Each of the metallic etch mask portion 159 is a patterned portion of the metallic etch mask material layer 159L that overlies a respective one of the memory cells (126, 130, 140, 146, 148, 158).

In one embodiment, each memory cell (126, 130, 140, 146, 148, 158) may be a magnetic tunnel junction (MTJ) memory cell. Each MTJ memory cell (126, 130, 140, 146, 148, 158) may include a bottom electrode 126, a magnetic tunnel junction structure (140, 146, 148), and a top electrode 158. Each magnetic tunnel junction (140, 146, 148) may include a synthetic antiferromagnet (SAF) structure 140, a nonmagnetic tunnel barrier layer 146, and a free magnetization layer 148. A nonmagnetic metallic buffer layer 130 may be provided between the bottom electrode 126 and the magnetic tunnel junction (140, 146, 148). Each bottom electrode 126 is a patterned portion of the bottom electrode material layer 126L. Each SAF structure 140 is a patterned portion of the SAF layer 140L. Each nonmagnetic tunnel barrier layer 146 is a patterned portion of the nonmagnetic tunnel barrier material layer 146L. Each free magnetization layer 148 is a patterned portion of the free magnetization material layer 148L. Each top electrode 158 is a patterned portion of the metallic etch mask material layer 158L. In one embodiment, the metallic etch mask portions 159 comprise, and/or consist essentially of, a conductive metallic nitride material (such as TiN, TaN, or WN), and each of the memory cells (126, 130, 140, 146, 148, 158) comprises a vertical stack including a synthetic antiferromagnet structure 140, a nonmagnetic tunnel barrier layer 146, and a free magnetization layer 148.

Figure 7:
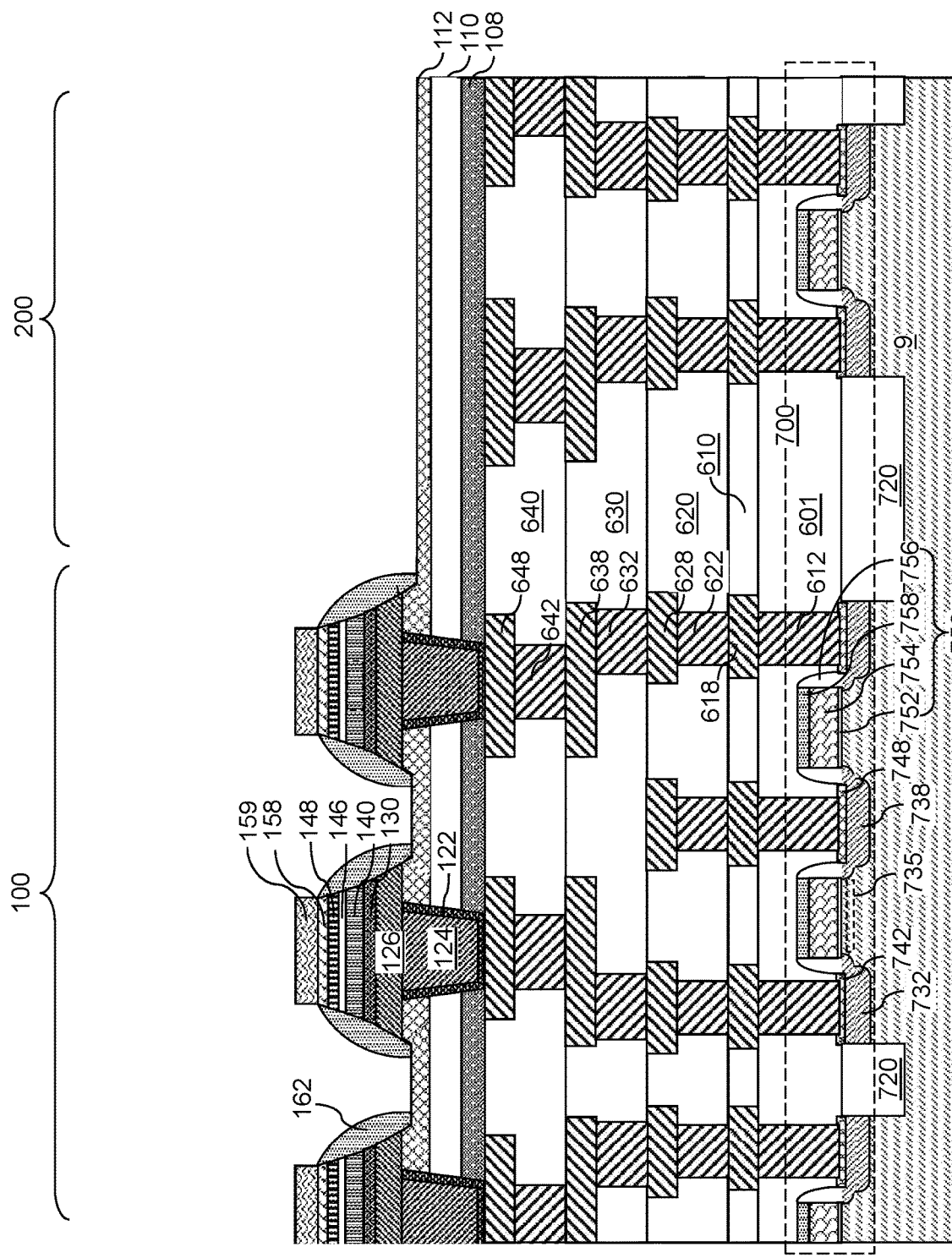
FIG. 7 is a vertical cross-sectional view of the exemplary structure after formation of an array of inner dielectric spacer portions according to an embodiment of the present disclosure.

FIG. 7 is a vertical cross-sectional view of the exemplary structure after formation of an array of inner dielectric spacer portions according to an embodiment of the present disclosure. Referring to FIG. 7, a first dielectric material such as silicon nitride may be conformally deposited over the array of memory cells (126, 130, 140, 146, 148, 158) and the array of metallic etch mask portions 159. For example, the first dielectric material may be deposited by a chemical vapor deposition process. The thickness of the first dielectric material over a horizontal surface may be in a range from 2 nm to 20 nm, such as from 4 nm to 10 nm, although lesser and greater thicknesses may also be employed. An anisotropic etch process may be performed to remove horizontal portions of the first dielectric material. Remaining portions of the first dielectric material comprise an array of inner dielectric spacer portions 162 that laterally surrounds the array of memory cells (126, 130, 140, 146, 148, 158). In one embodiment, the duration of the anisotropic etch process may be selected such that sidewalls of the array of metallic etch mask portions 159 are partly or fully physically exposed. The maximum thickness of each inner dielectric spacer portion 162 may be in a range from 2 nm to 20 nm, such as from 4 nm to 10 nm, although lesser and greater thicknesses may also be employed.

Figure 8:
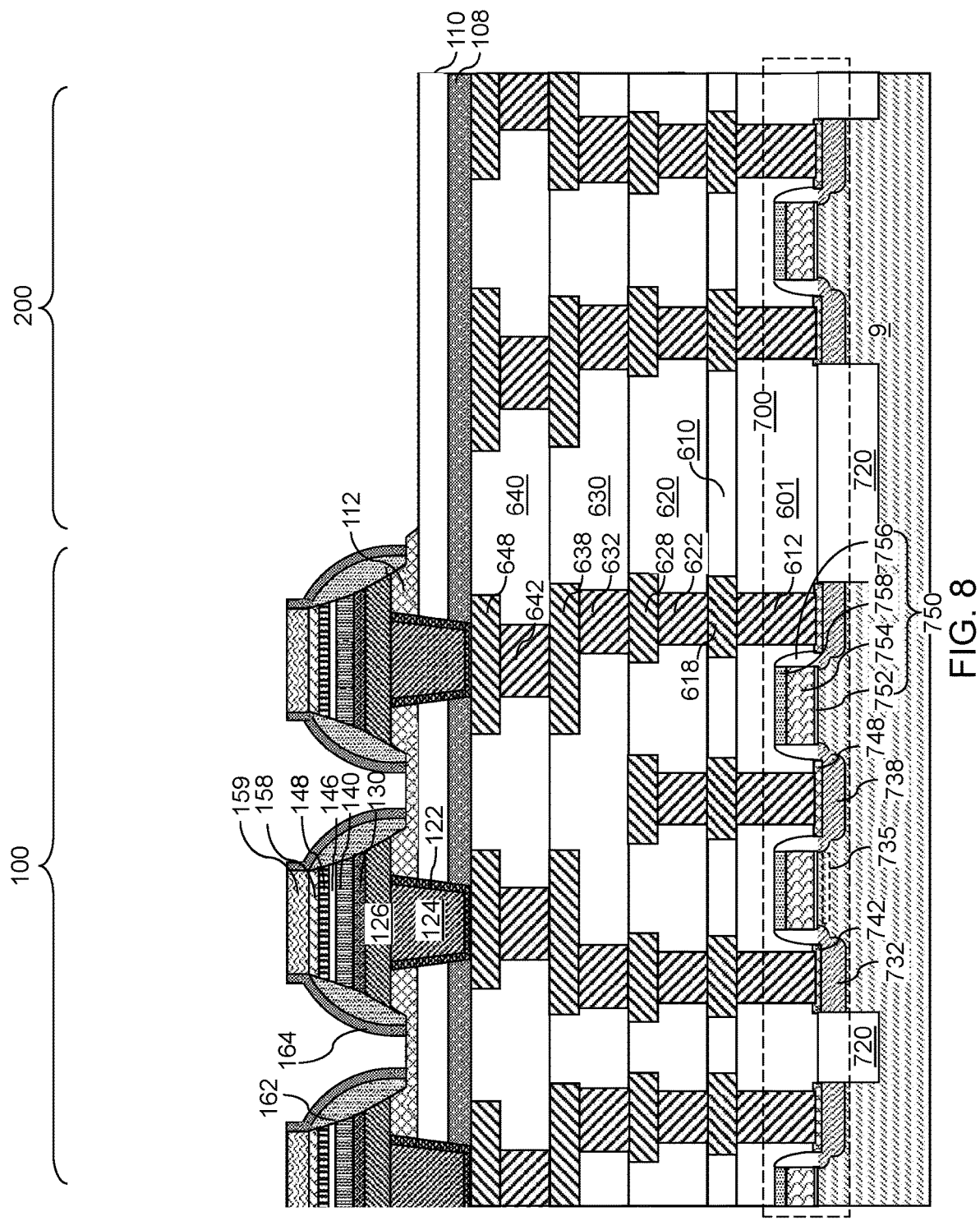
FIG. 8 is a vertical cross-sectional view of the exemplary structure after formation of an array of outer dielectric spacer portions according to an embodiment of the present disclosure.

FIG. 8 is a vertical cross-sectional view of the exemplary structure after formation of an array of outer dielectric spacer portions according to an embodiment of the present disclosure. Referring to FIG. 8, a second dielectric material such as a dielectric metal oxide may be conformally deposited over the array of inner dielectric spacer portions 162. For example, the second dielectric material may include aluminum oxide, hafnium oxide, lanthanum oxide, or yttrium oxide, and may be deposited by a chemical vapor deposition process. The thickness of the second dielectric material over a horizontal surface may be in a range from 2 nm to 20 nm, such as from 4 nm to 10 nm, although lesser and greater thicknesses may also be employed. An anisotropic etch process may be performed to remove horizontal portions of the second dielectric material. Remaining portions of the second dielectric material comprise an array of outer dielectric spacer portions 164 that laterally surrounds the array of inner dielectric spacer portions 162. In one embodiment, the outer dielectric spacer portions 164 may be deposited directly on sidewalls of the metallic etch mask portions 159. In one embodiment, the entirety of each sidewall of the metallic etch mask portions 159 may contact a respective outer dielectric spacer portion 164. The maximum thickness of each outer dielectric spacer portion 164 may be in a range from 2 nm to 20 nm, such as from 4 nm to 10 nm, although lesser and greater thicknesses may also be employed.

Each contiguous combination of an inner dielectric spacer portion 162 and an outer dielectric spacer portion 164 constitutes a dielectric spacer (162, 164). An array of dielectric spacers (162, 164) laterally surrounds the array of memory cells (126, 130, 140, 146, 148, 158) and the array of metallic etch mask portions 159. While the present disclosure is described employing an embodiment in which a dielectric spacer (162, 164) includes an inner dielectric spacer portion 162 and an outer dielectric spacer portion 164, embodiments are expressly contemplated herein in which a dielectric spacer consists of an inner dielectric spacer portion 162 or consists of an outer dielectric spacer portion 164. Generally, a dielectric spacer (162, 164) may be formed around each metallic etch mask portion 159 within the array of metallic etch mask portions 159. Each dielectric spacer (162, 164) may be formed directly on, and around, a sidewall of a respective metallic etch mask portion 159.

The etching processes performed in FIGS. 7 and 8 may cause the buffer layer 112 to recess further while still maintaining layers (108, 110) to protect the metal line structures 648 in the logic region 200 from exposure and contamination. In one embodiment, subsequent etching processes may be performed after forming and etching the dielectric spacers (162, 164) as shown in FIG. 8 to completely remove the buffer layer 112 in the logic region 200, thus exposing the connection-via-level dielectric layer 110. By first forming the dielectric spacers (162, 164) before removing the buffer layer 112 within the logic region 200 may allow for the protection of the connection-via-level dielectric layer 110, such that the connection-via-level dielectric layer 110 may not be etched in excess during the formation of the MTJ structures. The buffer layer 112 may be removed through a wet etching process in preparation of depositing further layers to complete the MTJ structure. For example, a wet etching process using hydrofluoric acid (HF) may be performed. The buffer layer 112 may be comprised of Al2O3, which has a wet etching rate in HF acid in a range of 220 to 260 A/min (e.g., 240 A/min). Performing a wet etching process to remove the buffer layer 112 in the logic region 200 may also partially remove exposed portions of the buffer layer 112 (e.g., between dielectric spacers (162, 164) in the memory array region 100. However, due to the loading effect during the previously performed IBE process, exposed portions of the buffer layer 112 in the memory array region 100 may be thicker than portions of the buffer layer 112 in the logic region 200. Therefore, the wet etch process may be controlled to remove the buffer layer 112 in the logic region 200 while retaining the buffer layer 112 in the memory array region 100. Controlling the wet etch process to retain portions of the buffer layer 112 within the memory array region 100 may prevent gaps or voids from forming around or below the dielectric spacers (162, 164).

Figure 9:
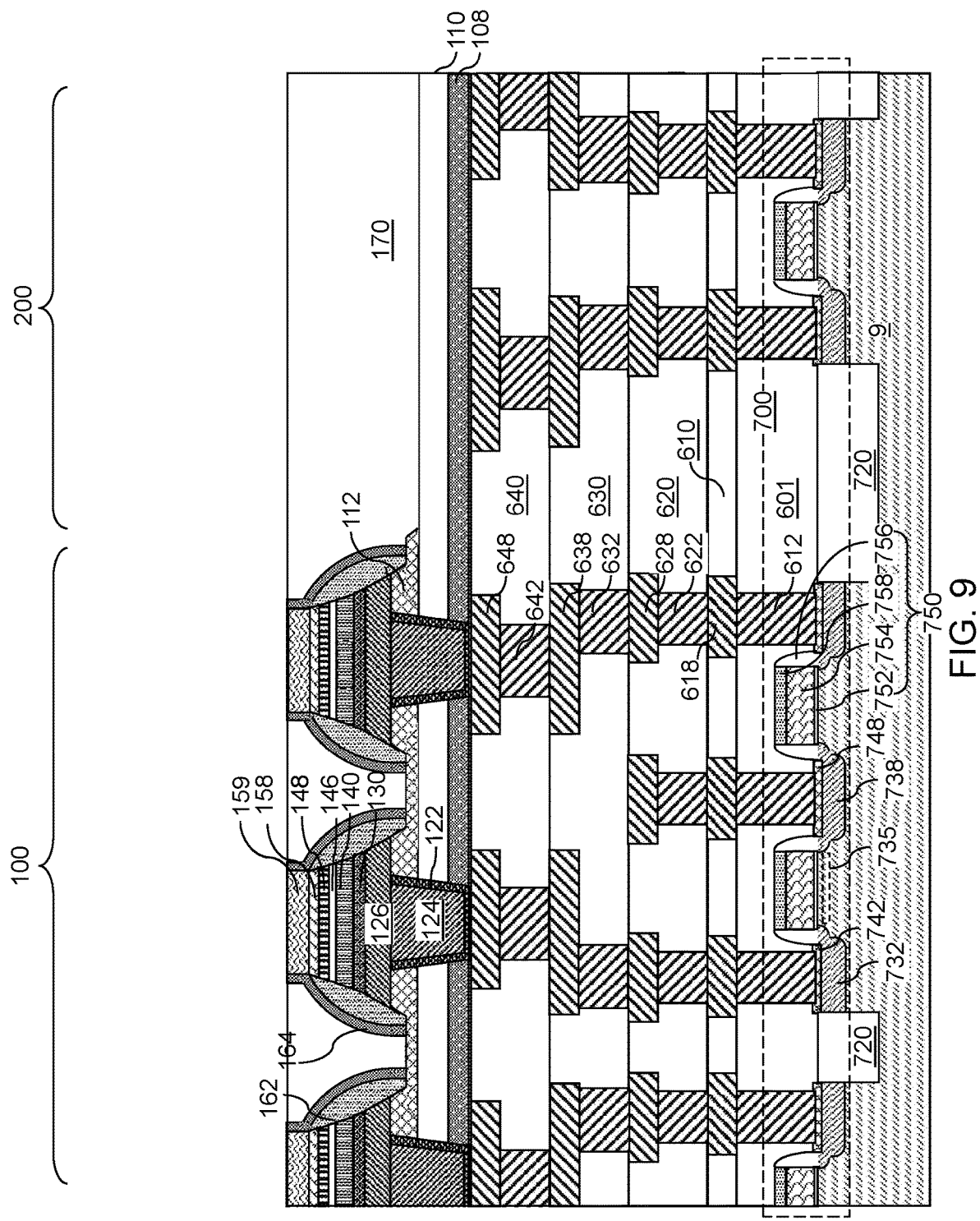
FIG. 9 is a vertical cross-sectional view of the exemplary structure after formation of a memory-level dielectric layer according to an embodiment of the present disclosure.

FIG. 9 is a vertical cross-sectional view of the exemplary structure after formation of a memory-level dielectric layer according to an embodiment of the present disclosure. Referring to FIG. 9, a memory-level dielectric layer 170 may be formed around the array of dielectric spacers (162, 164). The memory-level dielectric layer 170 includes a planarizable dielectric material such as undoped silicate glass or a doped silicate glass. The dielectric material of the memory-level dielectric layer 170 may be deposited by a conformal deposition process (such as a chemical vapor deposition process) or a self-planarizing deposition process (such as spin coating). A chemical mechanical planarization process may be performed to remove portions of the deposited dielectric material from above the horizontal plane including the top surfaces of the metallic etch mask portions 159. Various planarization assist structures (not shown) such as electrically isolated patterned portions of the metallic etch mask material layer 159L and underlying material layers may be employed in the logic region 200 to assist planarization of the deposited dielectric material. Remaining portions of the deposited dielectric material after the planarization process constitute the memory-level dielectric layer 170. The top surface of the memory-level dielectric layer 170 may be within the same horizontal plane as the top surfaces of the metallic etch mask portions 159. In one embodiment, top surfaces of the dielectric spacers (162, 164), such as the top surfaces of the outer dielectric spacer portions 164, may be within the same horizontal plane as the top surface of the memory-level dielectric layer 170.

Figure 10:
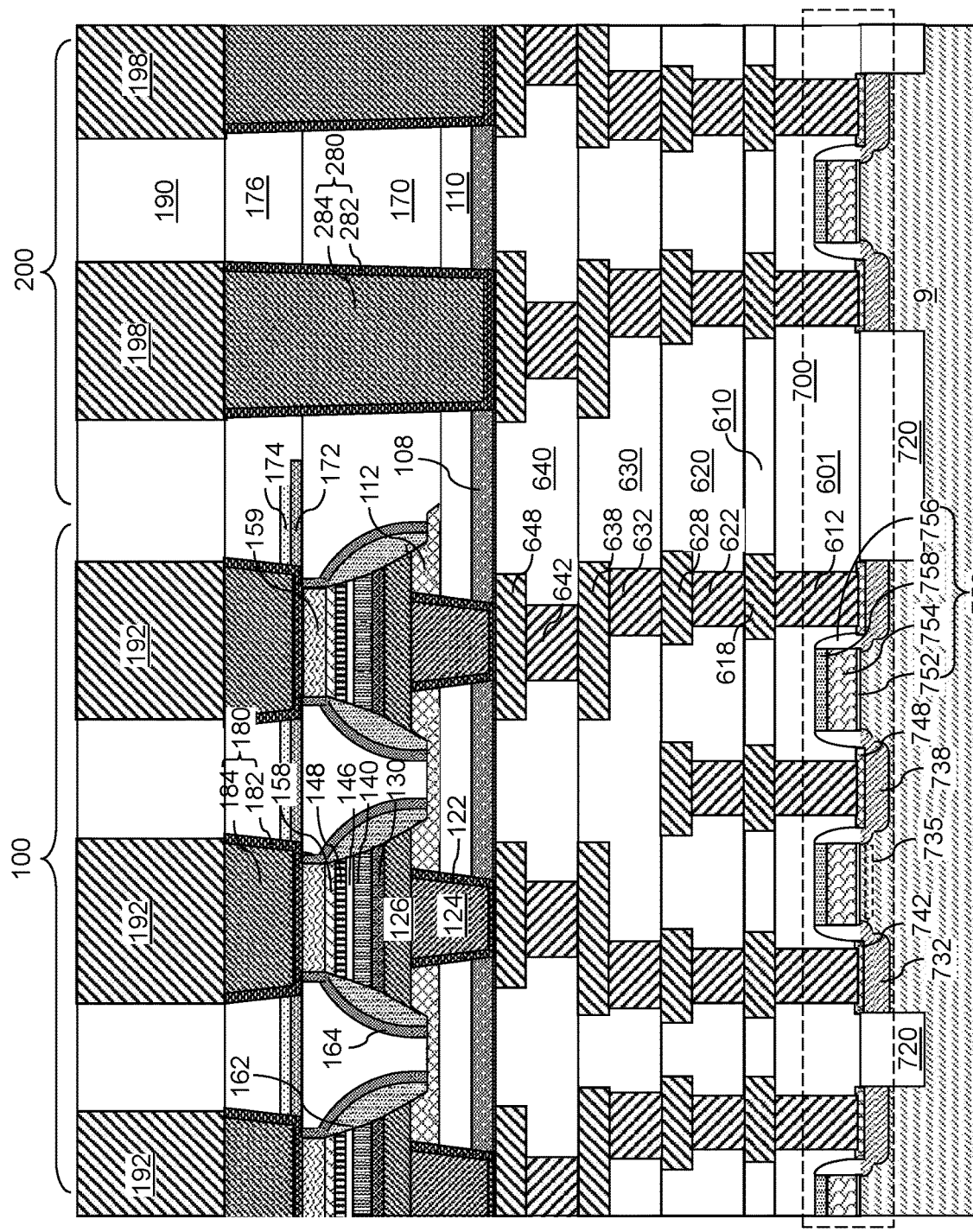
FIG. 10 is a vertical cross-sectional view of the exemplary structure after formation of an array contact structures within the memory array region 100 and the logic region 200 according to an embodiment of the present disclosure.

FIG. 10 is a vertical cross-sectional view of the exemplary structure after formation of an array contact structures within the memory array region 100 and the logic region 200 according to an embodiment of the present disclosure. Referring to FIG. 10, methods may be used to complete the fabrication process of the MTJ structures illustrated in FIGS. 2-10 in conjunction with the buffer layer 112. For example, any further processes to complete the MTJ structures may involve etching remaining portions, if any, of the buffer layer 112 in the logic region 200 to deposit metal or contact layers with the metal line structures 648. Disposing the buffer layer 112 over the connection-via-level dielectric layer 110 may prevent over-etching of the connection-via-level dielectric layer 110 during a second anisotropic etch process that is used to form the individual memory cells in the memory array region 100. In this manner, the metal line structures 648 in the logic region 200 may be protected from exposure and contamination. By including a buffer layer 112 having a relative ion beam etching rate of 0.8 to 1.3 over the connection-via-level dielectric layer 110, the amount of etch due to the loading effect of the second anisotropic etch process may be reduced by as much as 67%.

An array of contact via structures 180 may be formed within the memory array region 100 and an array of connection via structures 280 may be formed within the logic region 200. Each contact via structure 180 includes a respective metallic barrier layer 182 and a respective metallic fill material portion 184. Each connection via structure 280 includes a respective metallic barrier layer 282 and a respective metallic fill material portion 284. The top surfaces of the contact via structures 180 and the connection via structures 280 may be within the same horizontal plane as the top surface of a via-level dielectric layer 176 (i.e. after performing a CMP process).

Generally, the contact via structures 180 may be formed by depositing at least one conductive material in via cavities (not shown) in the memory array region 100, and the connection via structures 280 may be formed by depositing the at least one conductive material in via cavities (not shown) in the logic region 200. The via cavities for the connection via structures 280 may be formed by removing portions, such as through an etching process, of the various layers including the via-level dielectric layer 176, the memory-level dielectric layer 170, the buffer layer 112 (if any remains in logic region 200), the connection-via-level dielectric layer 110, and the dielectric cap layer 108. Each contact via structure 180 may be formed directly on a top surface of a respective metallic etch mask portion 159 exposed within a respective via cavity. An array of contact via structures 180 may be formed on the top surfaces of metallic etch mask portions 159 in the array of the via cavities. In embodiments in which the upper portion of each via cavity has a greater lateral extent than the downward-protruding portion of the respective via cavity in the memory array region 100, a horizontal bottom surface of each contact via structure 180 may contact a horizontal surface of a dielectric spacer (162, 164) and/or a horizontal surface of the memory-level dielectric layer 170. In one embodiment, the horizontal surface of a contact via structure 180 that contacts the dielectric spacer (162, 164) and/or the memory-level dielectric layer 170 may include an annular bottom surface of the upper portion of the contact via structure 180.

Each connection via structure 280 may be formed directly on a top surface of a respective metal interconnect structures 648. For example, the connection-via-level dielectric layer 110 and the dielectric cap layer 108 may remain after performing the IBE etch process and any subsequent etching processes. Thus, additional deposition (forming masks) and etching processes may be performed to etch any remaining portions of the buffer layer 112 (if any remains in the logic region 200), selected portions of the connection-via-level dielectric layer 110, and selected portions of the dielectric cap layer 108 to expose a top surface of the respective metal interconnect structures 648. Such etching processes may also etch the memory-level dielectric layer 170, a first dielectric etch stop layer 172, a second dielectric etch stop layer 174, and a via-level dielectric layer 176 to form via-level cavities in which the connection via structures 280 may be formed.

A line-level dielectric layer 190 may be deposited over the via-level dielectric layer 176. The line-level dielectric layer 190 may include any inter-layer dielectric (ILD) material. The thickness of the line-level dielectric layer 190 may be in a range from 100 nm to 600 nm, such as from 150 nm to 300 nm, although lesser and greater thicknesses may also be used. Line trenches may be formed through the line-level dielectric layer 190, for example, by applying and patterning a photoresist layer over the line-level dielectric layer 190, and by transferring the pattern in the photoresist layer through the line-level dielectric layer 190 by performing an anisotropic etch process. The photoresist layer may be subsequently removed, for example, by ashing. At least one contact via structure 180 and/or at least one connection via structure 280 may be physically exposed at the bottom of each line trench. At least one conductive material (such as a combination of a metallic barrier material and a metallic fill material) may be deposited in the line trenches, and excess portions of the at least one conductive material may be removed from above the horizontal plane including the top surface of the line-level dielectric layer 190 by a planarization process such as a CMP process. Remaining portions of the at least one conductive material that fill the line trenches comprise metal line structures (192, 198). The metal line structures (192, 198) may include array-connection metal lines 192 that contact at least one of the contact via structures 180 and logic-region metal lines 198 that do not directly contact the contact via structures 180. In one embodiment, the array-connection metal lines 192 may include word lines or bit lines for the two-dimensional array of memory cells (126, 130, 140, 146, 148, 158).

Figure 11:
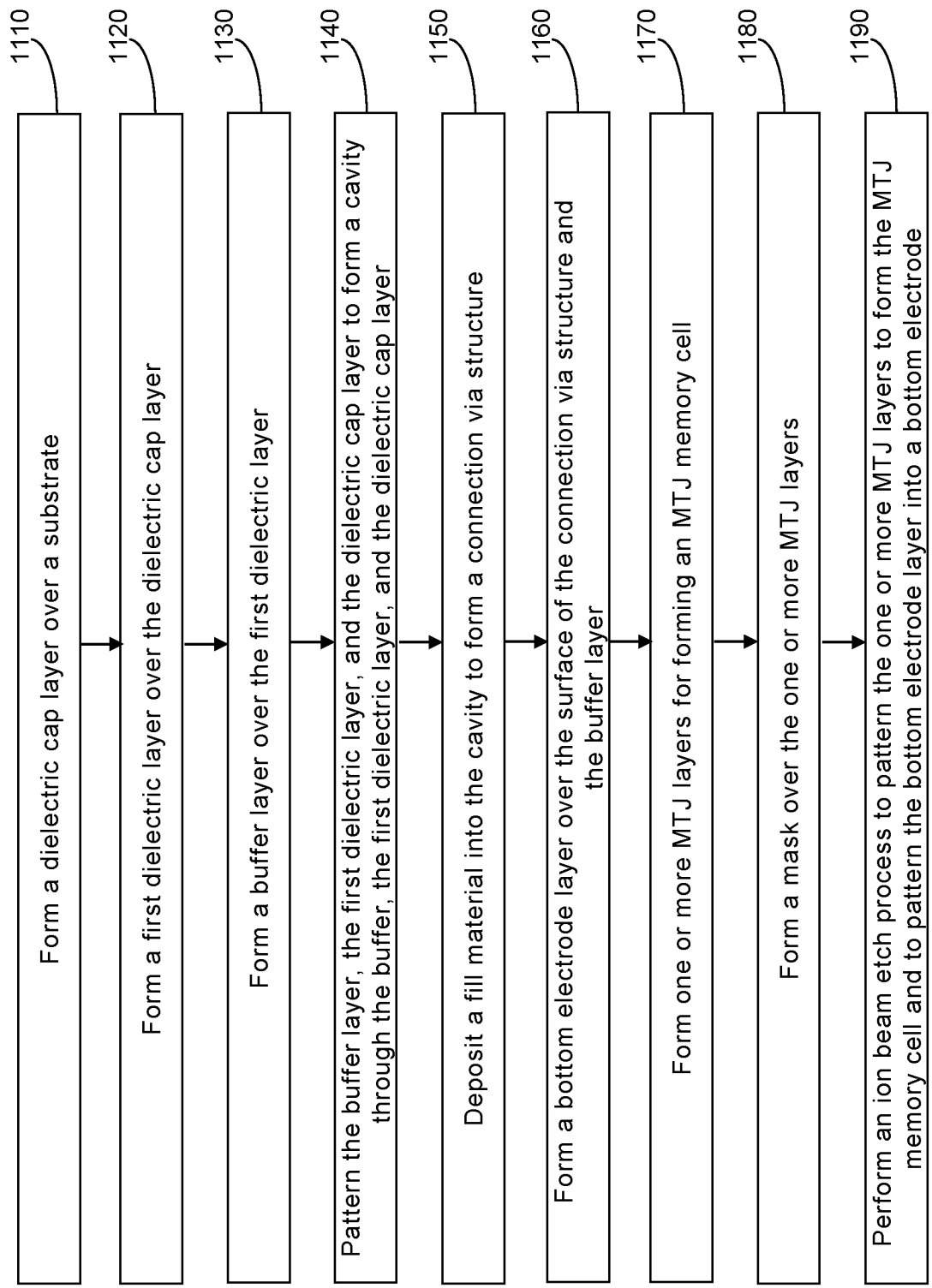
FIG. 11 is a flowchart that illustrates the general processing steps of the methods of the present disclosure.

Referring to FIG. 11, a flowchart illustrates the general processing steps of the methods of the present disclosure for forming a single MTJ memory device. An MTJ memory device may be formed by this method. Referring to step 1110 and FIG. 2, a dielectric cap layer (108) may be formed over a substrate (9). Referring to step 1120 and FIG. 2, a first dielectric layer (110) may be formed over the dielectric cap layer (108). Referring to step 1130 and FIG. 2, a buffer layer (112) may be formed over the first dielectric layer (110). Referring to step 1140 and FIG. 3, the buffer layer (112), the first dielectric layer (110), and the dielectric cap layer (108) may be patterned to form a cavity through the buffer layer (112), the first dielectric layer (110), and the dielectric cap layer (108). Referring to step 1150 and FIG. 3, a fill material (124) may be deposited into the cavity to form a connection via structure (122, 124). Referring to step 1160 and FIG. 4, a bottom electrode layer (126L) may be formed over the surface of the connection via structure (122, 124) and the buffer layer (112). Referring to step 1170 and FIG. 4, one or more MTJ layers may be formed for forming an MTJ memory cell (126, 130, 140, 146, 148, 158). Referring to step 1180 and FIG. 5, a mask (e.g., photoresist layer 177) may be formed over the one or more MTJ layers. Referring to step 1190 and FIG. 6, an ion beam etch process may be performed to pattern the one or more MTJ layers to form the MTJ memory cell (126, 130, 140, 146, 148, 158) and to pattern the bottom electrode layer (126L) into a bottom electrode (126), such that the buffer layer (112) prevents the ion beam etch process from exposing underlying metal interconnect structures 648.

Referring to all drawings and according to various embodiments of the present disclosure, a memory cell structure is provided. The memory cell structure may include a first dielectric layer (110). The memory cell structure may further include a buffer layer (112) disposed over the first dielectric layer (110), and a connection via structure (122, 124) embedded in the buffer layer (112) and the first dielectric layer (110). The memory cell device may further include a bottom electrode (126) disposed on the connection via structure (122, 124) and the buffer layer (112), in which the buffer layer has an etching rate of 0.8 to 1.3 relative to a bottom electrode etching rate. The memory cell device may further include an MTJ memory cell (126, 130, 140, 146, 148, 158) including one or more MTJ layers disposed on the bottom electrode (126).

In one embodiment, the buffer layer (112) may be comprised of aluminum oxide ($Al_2O_3$). In another embodiments, the buffer layer (112) may be comprised of tantalum pentoxide ($Ta_2O_5$). In one embodiment, the buffer layer (112) may have a vertical thickness of 10 nanometers to 70 nanometers. In one embodiment, the buffer layer (112) may have a vertical thickness ratio of 0.7 to 1 relative to a vertical thickness of the bottom electrode (126). In one embodiment, the buffer layer (112) has a relative ion beam etching rate of 0.8 to 1.3 relative to the ion beam etching rate of the bottom electrode (126). In one embodiment, exposed portions of the buffer layer (112) may be removed through a wet etch process. In one embodiment, the buffer layer (112) may have a wet etch rate of 240 A/min.

Referring to all drawings and according to various embodiments of the present disclosure, an MTJ memory device is provided. The MTJ memory device may include an array of MTJ memory cells located over a substrate (9), wherein each of the MTJ memory cells (126, 130, 140, 146, 148, 158) comprises a bottom electrode (126), one or more MTJ layers (130, 140, 146, 148), and a top electrode (158). The MTJ memory device may further include an array of connection via structures, such that each connection via structure (122, 124) of the array of connection via structures may contact a bottom surface of a respective bottom electrode (126) of a respective one of the MTJ memory cells (126, 130, 140, 146, 148, 158). The MTJ memory device may further include a buffer layer (112) that may surround sidewalls of the connection via structures (122, 124), such that a top surface of the buffer layer (112) may contact a bottom surface of each bottom electrode (126) of each of the MTJ memory cells (126, 130, 140, 146, 148, 158) of the array of MTJ memory cells. In one embodiment, the array of MTJ memory cells (126, 130, 140, 146, 148, 158) may be disposed within a memory array region (100). In one embodiment, the buffer layer (112) may be disposed within the memory array region (100) and a logic region (200) having a lower element density than the memory array region (100) (i.e. the logic region has fewer structural elements than the memory array region across a horizontal plane of the MTJ memory device).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell structure, comprising:
a first metal line structure embedded in a dielectric material layer overlying a substrate and having a top surface within a horizontal plane including a top surface of the dielectric material layer;
a dielectric layer stack overlying the first metal line structure and the dielectric material layer and including, from bottom to top, a dielectric cap layer, a connection-via-level dielectric layer, and a buffer layer;
a connection via structure contacting a top surface of the first metal line structure, vertically extending through the dielectric layer stack, and having a top surface that is coplanar with a first horizontal surface segment of a top surface of the buffer layer;
a bottom electrode disposed on the connection via structure and the buffer layer;
a magnetic tunnel junction (MTJ) memory cell including one or more MTJ layers and disposed on the bottom electrode in a memory array region;
a dielectric spacer laterally surrounding the MTJ memory cell; and
a memory-level dielectric layer that comprises a dielectric material which is laterally spaced by the dielectric spacer from the MTJ memory cell, wherein the dielectric material of the memory-level dielectric layer laterally surrounds the MTJ memory cell, directly contacts a second horizontal surface segment of the top surface of the buffer layer that is vertically recessed relative to the first horizontal surface segment of the top surface of the buffer layer in the memory array region, and directly contacts a horizontal surface of the connection-via-level dielectric layer in a logic region that is laterally spaced from the memory array region.

2. The memory cell structure of claim 1, wherein the buffer layer comprises aluminum oxide ($Al_2O_3$).

3. The memory cell structure of claim 1, wherein:
the dielectric cap layer comprises silicon nitride or silicon carbide; and
the connection-via-level dielectric layer comprises undoped silicate glass or a doped silicate glass.

4. The memory device of claim 1, wherein:
an entirety of a bottom surface of the bottom electrode is in contact with the top surface of the connection via structure and a horizontal top surface segment of the buffer layer.

5. The memory device of claim 1, further comprising:
a second metal line structure embedded in the dielectric material layer and located in the logic region; and
a connection via structure vertically extending through the memory-level dielectric layer, the connection-via-level dielectric layer, and the dielectric cap layer, contacting a top surface of the second metal line structure, and not in direct contact with the buffer layer.

6. The memory device of claim 5, further comprising a via-level dielectric layer laterally extending across the memory array region and the logic region, wherein a top surface of the connection via structure is coplanar with a top surface of the via-level dielectric layer.

7. The memory device of claim 6, further comprising a contact via structure overlying the MTJ memory cell and laterally surrounded by, and in contact with, the via-level dielectric layer.

8. The memory device of claim 7, wherein the contact via structure has a top surface that is coplanar with the top surface of the via-level dielectric layer.

9. The memory device of claim 7, wherein:
the MTJ memory cell comprises a top electrode; and
the memory device further comprises a metallic etch mask portion in contact with a top surface of the top electrode of the MTJ memory cell and in contact with a bottom surface of the contact via structure.

10. The memory device of claim 9, wherein the memory device further comprises:
a first dielectric etch stop layer located in the memory array region and overlying the memory-level dielectric layer; and
a second dielectric etch stop layer located in the memory array region and overlying the first dielectric etch stop layer and underlying the via-level dielectric layer,
wherein the first dielectric etch stop layer and the second dielectric etch stop layer are not in direct contact with the connection via structure.

11. A magnetic tunnel junction (MTJ) memory device comprising:
metal line structures embedded in a dielectric material layer overlying a substrate and having a respective top surface within a horizontal plane including a top surface of the dielectric material layer;
a dielectric layer stack overlying the metal line structures and the dielectric material layer and including, from bottom to top, a dielectric cap layer, a connection-via-level dielectric layer, and a buffer layer;
an array of connection via structures contacting a top surface of a respective one of the metal line structures, vertically extending through the dielectric layer stack, and having a respective top surface that is coplanar with a respective first horizontal surface segment of a top surface of the buffer layer; and
an array of MTJ memory cells located in a memory array region over the dielectric layer stack and the array of connection via structures;
an array of dielectric spacers laterally surrounding a respective MTJ memory cell within the array of memory cells; and
a memory-level dielectric layer that comprises a dielectric material which is laterally spaced by a respective dielectric spacer within the array of dielectric spacers from a respective MTJ memory cell within the array of MTJ memory cells, wherein the dielectric material of the memory-level dielectric layer laterally surrounds the MTJ memory cell, directly contacts a second horizontal surface segment of the top surface of the buffer layer that is vertically recessed relative to the first horizontal surface segment of the top surface of the buffer layer in the memory array region, and directly contacts a horizontal surface of the connection-via-level dielectric layer in a logic region that is laterally spaced from the memory array region, wherein each of the MTJ memory cells comprises:
a bottom electrode having a bottom surface that contacts a respective one of the connection via structures;
one or more MTJ layers; and
a top electrode.

12. The MTJ memory device of claim 11, wherein the array of MTJ memory cells is disposed within a memory array region, and wherein the buffer layer is disposed within the memory array region and a logic region having a lower element density than the memory array region.

13. The MTJ memory device of claim 11, wherein the buffer layer comprises aluminum oxide ($Al_2O_3$) or tantalum pentoxide ($Ta_2O_5$).

14. The MTJ memory device of claim 11, wherein the buffer layer comprises aluminum oxide ($Al_2O_3$).

15. A magnetic tunnel junction (MTJ) memory device comprising:
metal line structures embedded in a dielectric material layer overlying a substrate and having a respective top surface within a horizontal plane including a top surface of the dielectric material layer;
a dielectric layer stack overlying the metal line structures and the dielectric material layer and including, from bottom to top, a dielectric cap layer, a connection-via-level dielectric layer, and a buffer layer;
an array of connection via structures contacting a top surface of a respective one of the metal line structures, vertically extending through the dielectric layer stack, and having a respective top surface; and
a first MTJ memory cell located in a memory array region over the dielectric layer stack and the array of connection via structures and comprising a first bottom electrode; and
a second MTJ memory cell located in the memory array region over the dielectric layer stack and the array of connection via structures and comprising a second bottom electrode, wherein the buffer layer comprises:
first horizontal surface segments contacting bottom surfaces of a respective one of the first bottom electrode and the second bottom electrode; and
a second horizontal surface segment located between proximate edges of the first bottom electrode and the second bottom electrode and vertically recessed relative to the first horizontal surface segments,
and wherein the MTJ memory device further comprises:
a first dielectric spacer laterally surrounding the first MTJ memory cell;
a second dielectric spacer laterally surrounding the second MTJ memory cell; and
a memory-level dielectric layer that comprises a dielectric material which is laterally spaced by the first dielectric spacer from the first MTJ memory cell, which is not in direct contact with, and is laterally spaced by the second dielectric spacer from, the second MTJ memory cell, wherein the dielectric material of the memory-level dielectric layer laterally surrounds the first MTJ memory cell and the second MTJ memory cell, directly contacts a second horizontal surface segment of the top surface of the buffer layer that is vertically recessed relative to the first horizontal surface segment of the top surface of the buffer layer in the memory array region, and directly contacts a horizontal surface of the connection-via-level dielectric layer in a logic region that is laterally spaced from the memory array region.

16. The MTJ memory device of claim 15, wherein:
the first MTJ memory cell further comprises:
a first inner dielectric spacer portion having an inner sidewall in contact with a sidewall of the first bottom electrode and a sidewall of the buffer layer that extends from the sidewall of the first bottom electrode; and
the second MTJ memory cell further comprises:
a second inner dielectric spacer portion having an inner sidewall in contact with a sidewall of the second bottom electrode and a sidewall of the buffer layer that extends from the sidewall of the second bottom electrode.

17. The MTJ memory device of claim of claim 16, wherein:
the first MTJ memory cell further comprises:
a first outer dielectric spacer portion having an inner sidewall in contact with an outer sidewall of the first inner dielectric spacer portion and having a bottom surface in contact with a first peripheral portion of the second horizontal surface segment; and
the second MTJ memory cell further comprises:
a second outer dielectric spacer portion having an inner sidewall in contact with an outer sidewall of the second inner dielectric spacer portion and having a bottom surface in contact with a second peripheral portion of the second horizontal surface segment.

18. The MTJ memory device of claim 16, wherein:
the sidewall of the buffer layer that extends from the sidewall of the first bottom electrode has a taper angle that is less than or equal to a taper angle of the first bottom electrode, and
the sidewall of the buffer layer that extends from the sidewall of the second bottom electrode has a taper angle that is less than or equal to a taper angle of the second bottom electrode.

19. The MTJ memory device of claim 15, wherein the buffer layer comprises aluminum oxide ($Al_2O_3$) or tantalum pentoxide ($Ta_2O_5$).

* * * * *